(12) United States Patent
Broeke et al.

(10) Patent No.: US 7,774,736 B2
(45) Date of Patent: *Aug. 10, 2010

(54) METHOD AND APPARATUS FOR PROVIDING OPTICAL PROXIMITY FEATURES TO A RETICLE PATTERN FOR DEEP SUB-WAVELENGTH OPTICAL LITHOGRAPHY

(75) Inventors: Douglas Van Den Broeke, Sunnyvale, CA (US); Jang Fung Chen, Cupertino, CA (US); Thomas Laidig, Point Richmond, CA (US); Kurt E. Wampler, Sunnyvale, CA (US); Stephen Duan-Fu Hsu, Freemont, CA (US)

(73) Assignee: ASML MaskTools B.V., AH Veldhoven (NL)

( * ) Notice: Subject to any disclaimer, the term of this patent is extended or adjusted under 35 U.S.C. 154(b) by 542 days.

This patent is subject to a terminal disclaimer.

(21) Appl. No.: 11/714,147

(22) Filed: Mar. 6, 2007

(65) Prior Publication Data

US 2007/0162889 A1 Jul. 12, 2007

Related U.S. Application Data

(62) Division of application No. 10/756,830, filed on Jan. 14, 2004, now Pat. No. 7,247,574.

(60) Provisional application No. 60/439,807, filed on Jan. 14, 2003.

(51) Int. Cl.
 *G06F 17/50* (2006.01)
(52) U.S. Cl. .......................................... 716/19; 716/21

(58) Field of Classification Search .............. 716/19–21
 See application file for complete search history.

(56) References Cited

U.S. PATENT DOCUMENTS 5,229,230 A 7/1993 Kamon (Continued)

FOREIGN PATENT DOCUMENTS

EP 1 202 119 A1 5/2002

(Continued)

OTHER PUBLICATIONS

Christoph Dolainsky, et al., "Simulation based method for sidelobe suppression," Optical Microlithography XIII, Proceedings of SPIE, 2000, pp. 1156-1162, vol. 4000.

(Continued)

*Primary Examiner*—Jack Chiang
*Assistant Examiner*—Binh C Tat
(74) *Attorney, Agent, or Firm*—Pillsbury Winthrop Shaw Pittman LLP

(57) ABSTRACT

A method of generating a mask design having optical proximity correction features disposed therein. The methods includes the steps of obtaining a desired target pattern having features to be imaged on a substrate; determining an interference map based on the target pattern, the interference map defining areas of constructive interference and areas of destructive interference between at least one of the features to be imaged and a field area adjacent the at least one feature; and placing assist features in the mask design based on the areas of constructive interference and the areas of destructive interference.

20 Claims, 15 Drawing Sheets

U.S. PATENT DOCUMENTS

| | | | |
|---|---|---|---|
| 5,682,323 | A | 10/1997 | Pasch et al. |
| 5,895,741 | A | 4/1999 | Hasegawa et al. |
| 6,037,082 | A | 3/2000 | Capodieci |
| 6,214,497 | B1 | 4/2001 | Stanton |
| 6,223,139 | B1 | 4/2001 | Wong et al. |
| 6,303,253 | B1 | 10/2001 | Lu |
| 6,355,382 | B1 | 3/2002 | Yasuzato et al. |
| 6,413,684 | B1 | 7/2002 | Stanton |
| 6,425,117 | B1* | 7/2002 | Pasch et al. ............ 716/21 |
| 6,519,760 | B2 | 2/2003 | Shi et al. |
| 6,777,141 | B2* | 8/2004 | Pierrat ............ 430/5 |
| 6,787,271 | B2 | 9/2004 | Cote et al. |
| 6,792,591 | B2 | 9/2004 | Shi et al. |
| 6,807,662 | B2 | 10/2004 | Toublan et al. |
| 6,845,497 | B2* | 1/2005 | Murai et al. ............ 716/20 |
| 7,247,574 | B2* | 7/2007 | Broeke et al. ............ 438/725 |
| 2002/0083410 | A1 | 6/2002 | Wu et al. |
| 2002/0152452 | A1 | 10/2002 | Socha |
| 2002/0157081 | A1 | 10/2002 | Shi et al. |
| 2003/0228541 | A1 | 12/2003 | Hsu et al. |
| 2004/0122636 | A1 | 6/2004 | Adam |
| 2006/0147815 | A1 | 7/2006 | Melvin |

FOREIGN PATENT DOCUMENTS

| | | | |
|---|---|---|---|
| EP | 1 237 046 A2 | 9/2002 | |
| JP | 4-216548 | 8/1992 | |
| WO | WO 02/03140 A1 | 1/2002 | |
| WO | WO 03/054626 A1 | 7/2003 | |

OTHER PUBLICATIONS

Nicolas Bailey Cobb, "Fast Optical and Process Proximity Correction Algorithms for Integrated Circuit Manufacturing," Ph.D. dissertation, Spring 1998, pp. 35-72, University of California at Berkeley.

J.A. Torres, et al., "Contrast-Based Assist Feature Optimization," Optical Microlithography XV, 2002, pp. 179-187, Proceedings of SPIE, vol. 4691, SPIE.

Olivier Toublan, et al., "Fully Automatic Side Lobe Detection and Correction Technique for Attenuated Phase Shift Masks," Optical Microlithography XIV, 2001, pp. 1541-1547, Proccedings of SPIE, vol. 4346, SPIE.

Michael S. Yeung, "Extension of the Hopkins theory of partially coherent imaging to include thin-film interference effects," Optical/Laser Microlithography VI, 1993, pp. 452-463, SPIE, vol. 1927.

Douglas Van Den Broeke, et al., "Near 0.3 $k_1$ Full Pitch Range Contact Hole Patterning Using Chromeless Phase Lithography (CPL)," Proceedings of the SPIE, Sep. 9, 2003, pp. 297-308, vol. 5256, SPIE.

Korean Office Action issued in corresponding Korean Patent Application No. KR 10-2004-0002728, Dated May 28, 2007.

* cited by examiner

METHOD AND APPARATUS FOR PROVIDING OPTICAL PROXIMITY FEATURES TO A RETICLE PATTERN FOR DEEP SUB-WAVELENGTH OPTICAL LITHOGRAPHY

RELATED APPLICATIONS

This application is a divisional of U.S. patent application Ser. No. 10/756,830, filed Jan. 14, 2004, now U.S. Pat No. 7,247,574 which claims priority from U.S. Provisional Application Ser. No. 60/439,807 filed Jan. 14, 2003 the contents of which are hereby incorporated by reference.

FIELD OF THE INVENTION

The present invention relates to photolithography, and in particular relates to a method of applying optical proximity techniques to mask layouts of deep sub-wavelength patterns that allow for the mask patterns to be imaged utilizing essentially any illumination condition, and which maintains resolution performance through pitch. In addition, the present invention relates to a device manufacturing method using a lithographic apparatus comprising a radiation system for providing a projection beam of radiation; a mask table for holding a mask, serving to pattern the projection beam; a substrate table for holding a substrate; and a projection system for projecting the patterned projection beam onto a target portion of the substrate.

BACKGROUND OF THE INVENTION

Lithographic projection apparatus (tools) can be used, for example, in the manufacture of integrated circuits (ICs). In such a case, the mask contains a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning"direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic apparatus as here described can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing. Thereafter, the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

The lithographic tool may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic tools are described, for example, in U.S. Pat. No. 5,969,441 and WO 98/40791, incorporated herein by reference.

The photolithography masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way.

Of course, one of the goals in integrated circuit fabrication is to faithfully reproduce the original circuit design on the wafer (via the mask). Another goal is to use as much of the semiconductor wafer real estate as possible. As the size of an integrated circuit is reduced and its density increases, however, the CD (critical dimension) of its corresponding mask pattern approaches the resolution limit of the optical exposure tool. The resolution for an exposure tool is defined as the minimum feature that the exposure tool can repeatedly expose on the wafer. The resolution value of present exposure equipment often constrains the CD for many advanced IC circuit designs.

Furthermore, the constant improvements in microprocessor speed, memory packing density and low power consumption for micro-electronic components are directly related to the ability of lithography techniques to transfer and form patterns onto the various layers of a semiconductor device. The current state of the art requires patterning of CD's well below the available light source wavelengths. For instance the current production wavelength of 248 nm is being pushed towards patterning of CD's smaller than 100 nm. This industry trend will continue and possibly accelerate in the next 5-10 years, as described in the International Technology Roadmap for Semiconductors (ITRS 2000).

Lithographic methods aimed at improving resolution, while retaining acceptable process latitude and robustness are classified as Resolution Enhancement Techniques (RET's) and comprise a very wide range of applications. As is known, printing mask features at near or below half of the optical exposure wavelength requires applying such resolution enhancement techniques, such as, for example, off-axis illumination (OAI), phase shift masks (PSM) and optical proximity correction (OPC) in combination with the use of a very high numerical aperture (NA>0.7).

However, while such techniques can be utilized to print sub-wavelength patterns, problems remain. As mentioned, the use of OAI is one technique that has been demonstrated and utilized successfully for improving the resolution for dense pitch features. However to date, this technique has been shown to severely degrade the imaging of isolated geometries in the case of both dark-field and bright-field mask types. Thus, the OAI technique by itself is unsuitable for printing random pitch features (i.e., features ranging from isolated to densely spaced). Sub-resolution assist features (SRAF, also known as scattering bars, SBs) have also been used to improve the printing of isolated features. By placing SBs adjacent to isolated features in a clear-field mask type, it makes the isolated feature behave as a dense feature, thereby achieving the improved printing performance when exposed under OAI. To date, the placement of SBs has been done by applying empirical rules. However, for semi-isolated or intermediate-pitch random features, the SB placement rules often need to be compromised mainly due to a lack of sufficient space for SB placement. Similarly, while adding anti-scattering bars (i.e., an anti-scattering bar is a bright mask feature that is applied on a dark-field mask, whereas a scatter bar is a dark feature applied in a clear field mask) to a mask design can improve the imaging for dark-field mask types, applying such anti-scattering bars through pitch and on random geometry has proved problematic. The problem becomes worse when utilizing attenuated PSM. This is due to much stronger optical proximity effect as compare to non-phase shifted mask type. The stronger optical proximity effect results in the through-pitch printing issues becoming much more severe. Thus, in order to. satisfactorily extend the printing resolution for deep sub-wavelength features, it is necessary to go beyond the present rule-based SB method for both non-phase-shifted and phase-shifted mask types.

Accordingly, there exists a need for a method of applying OPC to a mask layout which allows for the printing of deep sub-wavelength features through pitch, and which cures the deficiencies and problems associated with the prior art RET techniques noted above.

SUMMARY OF THE INVENTION

In an effort to solve the foregoing needs, it is one object of the present invention to provide a method of providing optical proximity correction features to a mask pattern which allows a full-pitch range of deep sub-wavelength mask patterns to be imaged using substantially any illumination condition, including highly coherent on-axis (partial coherence<0.4) and strong off-axis illuminations (such as, for example, Quasar, double dipole, and single dipole illumination). As explained in detail below, in accordance with the method of the present invention, assist features are added to a mask pattern that do not print on the wafer (i.e., sub-resolution or non-printing features), but which enhance the aerial image of the intended mask features resulting in higher printing resolution with greater process latitudes. Importantly, the placement of the assist features is determined based on an "Interference Map", which defines whether each point in an optical area of interest interferes constructively or destructively with the desired target pattern.

More specifically, the present invention relates a method of generating a mask design having optical proximity correction features disposed therein. The method includes the steps of: obtaining a desired target pattern having features to be imaged on a substrate; determining an interference map based on the target pattern, the interference map defining areas of constructive interference and areas of destructive interference between at least one of the features to be imaged and a field area adjacent the at least one feature; and placing assist features in the mask design based on the areas of constructive interference and the areas of destructive interference.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include:

a) A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. Nos. 5,296,891 and 5,523,193, which are incorporated herein by reference.

b) A programmable LCD array. An example of such a construction is given in U.S. Pat. No. 5,229,872, which is incorporated herein by reference.

The method of the present invention provides important advantages over the prior art. Most importantly, the OPC technique of the present invention allows for deep sub-wavelength mask patterns to be imaged using substantially any illumination condition through pitch. As a result, the present invention allows a technique for printing, for example, contact arrays having randomly placed contacts ranging from isolated contacts to dense contacts (i.e., not all contacts uniformly spaced from one another) utilizing a single illumination. In contrast, prior art OPC techniques typically required multiple exposures in order to provide for printing of both isolated and densely spaced features to obtain acceptable resolution results. One specific advantage is that the present invention realizes optimum printing performance for a full-pitch range features utilizing OAI.

Additional advantages of the present invention will become apparent to those skilled in the art from the following detailed description of exemplary embodiments of the present invention.

The invention itself, together with further objects and advantages, can be better understood by reference to the following detailed description and the accompanying drawings.

DETAILED DESCRIPTION OF THE INVENTION

As explained in more detail below, the OPC technique of the present invention allows for a full-pitch range of deep sub-wavelength mask patterns to be imaged utilizing substantially any illumination condition. The OPC technique entails generating an Interference Map (IM), which indicates how each point in the field surrounding the desired target pattern interacts with the target pattern. The possibilities are that a given point either constructively interferes, destructively interferes or is neutral (i.e., neither constructive or destructive interference) with respect to the target pattern. Once the IM is generated, it is utilized to determine where assist features are placed with respect to the desired pattern. Specifically, assist features which enhance the constructive interference are positioned at locations in the field indicated by the IM to be providing constructive interference, assist features which function to reduce destructive interference are positioned at locations in the field indicated by the IM to be providing destructive interference, and in neutral areas of the field either type of the assist feature (or both) can be utilized. The method of the present invention expands the concept of scatter-bars "SB" and anti-scatter bars "ASB" to encompass the employment of both SB/ASB and non-printing features "NPF" together as a means of OPC for enhancing the printing of deep sub-wavelength features.

It is noted that the following are the definitions of non-printing features (NPF) & anti-Scattering Bars (ASB or sub-resolution assist features used on a dark-field mask type) that are used in the subsequent description and drawings.

NPF—a type of pattern where under standard imaging conditions it would print but because of the design of phase shifted (−1 electric field amplitude), non-phase shifted (+1 electric field amplitude), and/or opaque (0 electric field amplitude) regions, destructive interference causes the pattern to become dark or non-printing in a dark-field mask type. The purpose of the pattern is to enhance the printing of the target pattern.

ASB—an ASB is bright mask feature that is applied on a dark-field mask type (whereas the SBs are dark features used in a clear field mask) which under standard imaging conditions is not printable because it is below the resolution capability of the optical system. The purpose of the ASB feature is to enhance the printing of the target pattern.

Figure 1:
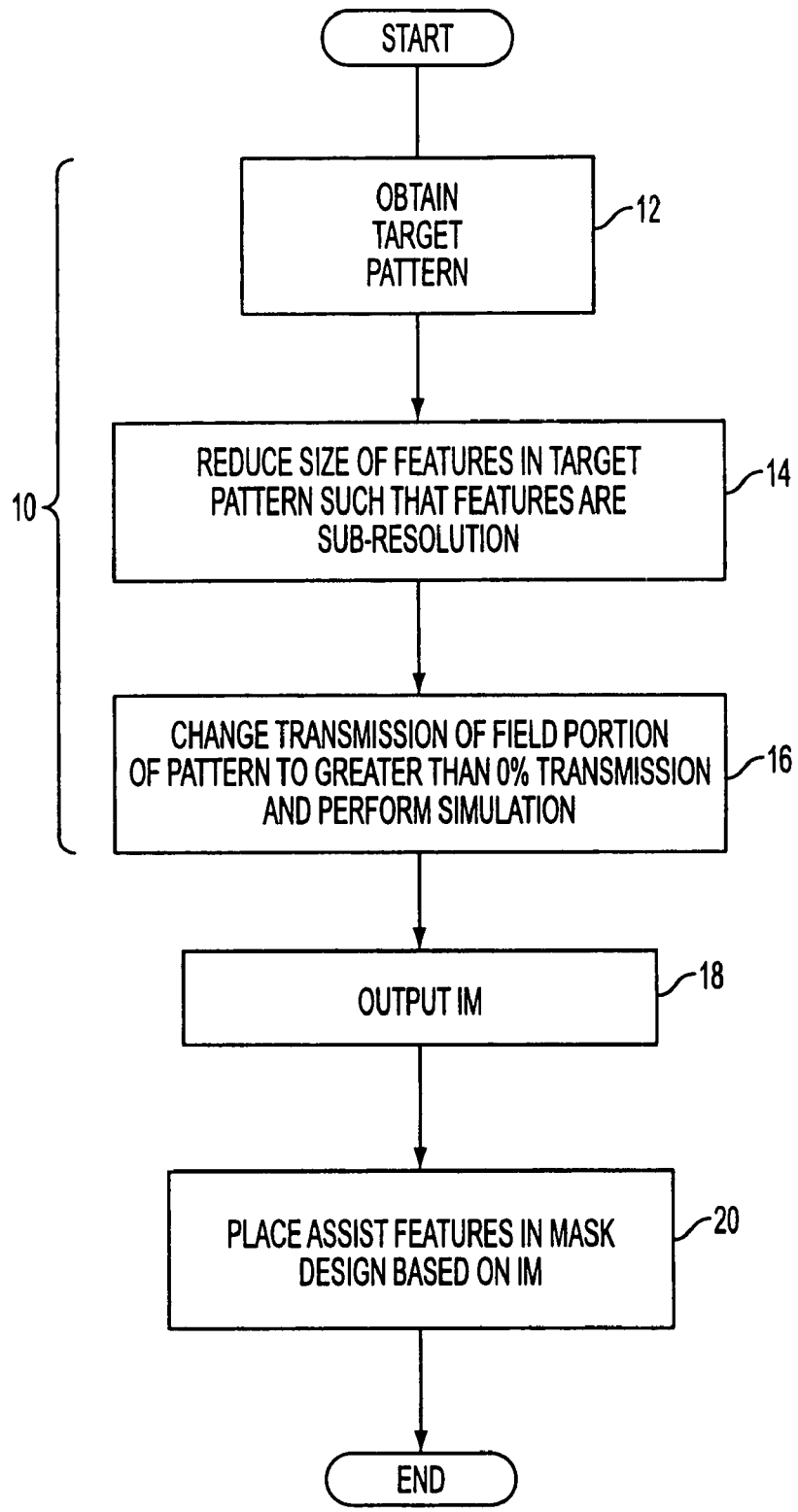
FIG. 1 is an exemplary flowchart illustrating the method of applying OPC techniques to a mask pattern in accordance with the present invention.

It is noted that the following discussion sets forth an example of the present invention utilizing a dark-field mask type, however, as would be obvious to those of skill in the art, the method is also applicable to clear field mask types. FIG. 1 is an exemplary flowchart illustrating the method of applying OPC techniques to a mask pattern in accordance with the present invention. Referring to FIG. 1, the first step (Step 10) in the process is the generation of an interference map. It is noted that the IM can be generated utilizing numerous methods, for example, using a conventional aerial image simulator (e.g., Lithocruiser or MaskWeaver simulation products offered by MaskTools, Inc.) as disclosed in the instant application or using an Eigenvalued image model kernel as disclosed in copending application Serial No. (to be determined). The steps for generating an IM using an conventional aerial image simulator are described below. It is noted that a similar procedure can also be established for a clear-field mask type.

As noted above, the IM indicates at each point (e.g., a grid point) in an optical region of interest for any given pattern whether transmitted light at that point will interfere constructively with the desired target pattern (thereby making the intensity of the transmitted light on the target pattern greater), destructively (thereby making the intensity of the transmitted light on the target pattern lower), or neutral (not altering the intensity of the transmitted light on the target pattern). One example for generating the IM is as follows.

First, the target pattern is obtained (Step 12) and the field target pattern (e.g., dark field) is reduced in size (Step 14) such that the target geometry (i.e., pattern) becomes significantly smaller than the resolution capability of the optical system to be utilized to image the mask. For example, the feature sizes contained in the target pattern are reduced such that the critical dimensions of the features are less than $\lambda/(2\pi \cdot NA)$, where $\lambda$ is the exposure wavelength of the imaging tool and NA stands for the numerical aperture of the lens of the exposure system. This reduced target pattern represents the center region of all the geometries that are in the target pattern, essentially changing the desired/target features to point sources. In other words, the object is to focus on the interaction (i.e., interference) that is occurring between the center of the feature and the surrounding field region. It is noted that only the size of the given features in the desired pattern is reduced, the pitch between the features (i.e., the distance from a center of a given feature to the center of another feature) remains unchanged from the original target pattern. By utilizing this pattern of "point sources", the influence of all of the target geometries that are within the optical region of a particular point in the dark field area will be included in the determination of whether intensity is added to or subtracted from the target pattern when light of a given phase transmits through that point of the field. As an example, an optical region may be an area which equals 10 wavelengths of the imaging device or less.

Once the target pattern is reduced, an optical simulation of the reduced pattern is performed setting the transmission of the reduced size pattern so that the "dark" field area has a transmission greater than zero but greatly less than the transmission through the "bright" geometry (Step 16). The field transmission is also phase shifted by 180 degrees relative to the geometry. Typical values could be 0.10 field transmission at 180 degree phase shift and 100% geometry/feature transmission at 0 phase shift. Of course, other values can also be utilized (e.g., a field transmission ranging from 4%-10%). It is noted that the optical simulation is performed using the desired optical conditions (e.g., wavelength, NA, and illumination) under which the target will be imaged. The result of this optical simulation is the IM (Step 18), and as illustrated more clearly in the examples set forth below, the IM represents the e-field in the image plane corresponding to the reduced target pattern.

It is noted that the adjustment of the field transmission to other than 0% transmission is performed to introduce a DC offset into the e-field generated by the simulation. By introducing this DC offset, it is possible for the e-field generated as a result of the simulation to exhibit both positive and negative shifts in the e-field relative to the DC offset. Without the DC offset, it would not be possible to discern negative shifts in the e-field.

Once the IM is generated, the next step in the process is to analyze the interference pattern in the field area surrounding each feature to be printed, and place SB, ASB or NPF in the field regions on the basis of whether the given region is positive, negative or neutral relative to the DC offset level (Step 20). More specifically, using the transmission values for the field region as defined in the current example (e.g., 10% transmission and 180° degree phase-shift):

i. regions of the field area where the aerial image intensity is greater than 0.10 indicate areas of the field which when 180 degree phase shifted light is transmitted thereon, the light will constructively interfere with the target pattern, making the target pattern brighter, ii. regions of the field area where the aerial image intensity is less than 0.10 indicate areas of the field which when 180 degree phase shifted light is transmitted thereon, the light will destructively interfere with the target pattern, making the target pattern darker, and iii. regions of the field area where the aerial image intensity is approximately 0.10 indicate areas of the field which when 180 degree phase shifted light is transmitted thereon, the light will neither constructively or destructively interfere with the target pattern.

Once the foregoing three regions are identified, assist features are placed in regions (i) and/or (ii) such that these regions function to constructively interfere with the target pattern. For region (i), this is accomplished in the given example by placing π-phase shifted assist features in these field regions, and by placing non-phase shifted assist features in field regions classified as region (ii). It is noted that because π-phase shifted light in region (ii) causes destructive interference, then non-phase shifted assist features will result in constructive interference in these regions. Thus, by generating the IM map is it possible to specifically identify how assist features can be utilized to generate constructive interference even in areas which, without such a process, would result in a degradation in the final resolution of the imaging process. It is further noted that while the foregoing example utilizes a field region which is π-phase shifted for the simulation, it is also possible to use a field region without a phase-shift. In such a case, the resulting regions and assist features to be utilized therein would also be the opposite (e.g., in region (i), if a non-phase shifted region resulted in constructive interference, the non-phase-shifted assist features would be utilized in that given region in the mask design).

In the neutral regions of the field (i.e., region(iii)), as noted either π-phase shifted, non-phase shifted assist features, or non-printing features can be utilized. However, it is noted that the assist feature contained in this region (or other regions) cannot be so large as to cause the assist feature to print. Accordingly, the design of the assist feature can include both π-phase shifted and non-phase shifted regions such that the resulting assist feature remains non-printable.

Thus, utilizing the foregoing example, in the case of binary dark field reticles, only ASB can be used, as there are no phase shifted regions on the reticle. The ASBs would be located in the areas of the mask pattern corresponding to areas of the IM where the aerial image intensity was less than 0.10. The size of the feature is made as large as possible without having the image print and contains as much of the minima area as possible.

In the case of dark field phase shifted reticles, both phase shifted and non-phase shifted ASB can be utilized. As with the binary pattern, non-phase shifted features are located in the areas of the mask pattern corresponding to areas of the IN where the aerial image intensity was less than 0.10. Phase shifted features are located in the areas of the mask pattern corresponding to areas of the IM where the aerial image intensity was greater than 0.10. In regions where the aerial image intensity was near 0.10, the pattern could be defined as non-phase shifted, phase shifted, or zero transmission in order to make what would be printable patterns non-printable.

An alternative method of determining regions of positive and negative interference (i.e., generating an IM) is by using empirical methods. For example, a pattern could be exposed with a 10% attenuated reticle onto a low contrast resist. The resist could then be partially developed and the remaining resist thickness (i.e. surface profile) could be used to determine the positive and negative regions. Areas of the resist that developed more than the unpatterned field area would be regions of constructive interference indicating where phase shifted assist features should be located. Areas where the resist was less developed (or thicker) would be regions of destructive interference indicating where non-phase shifted assist features should be located.

A few examples of utilizing the method of the present invention to print contact hole patterns are set forth below. However, it should be noted that the present invention is not limited to the printing of contact holes. Indeed, it can be utilized in conjunction with the printing of substantially any mask pattern.

Figure 2:
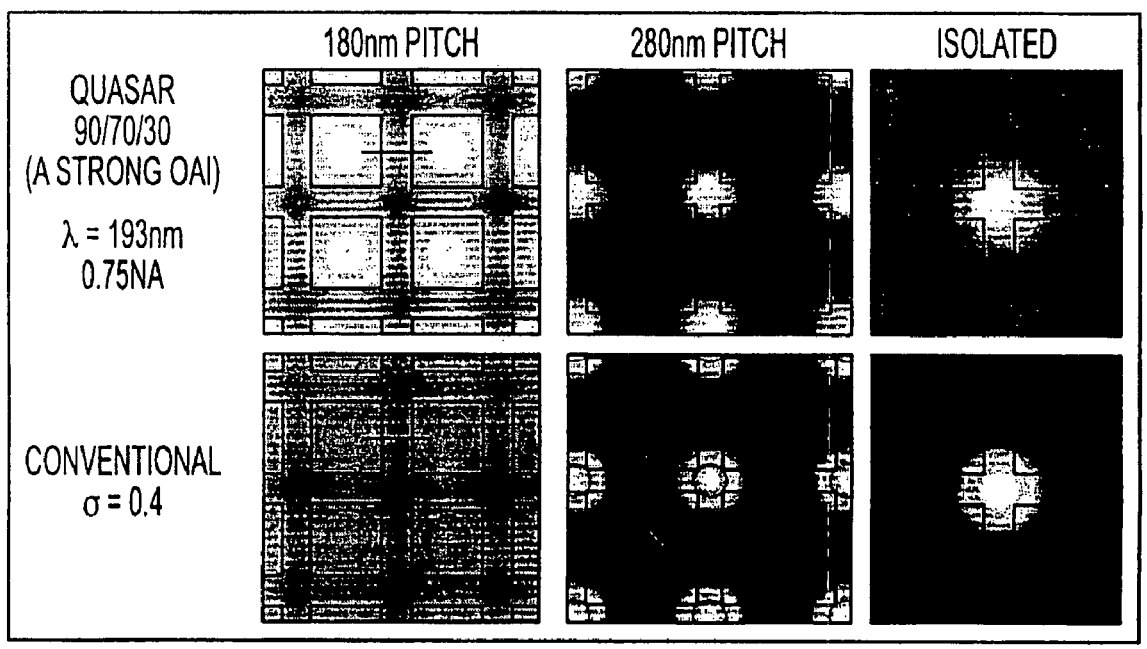
FIG. 2 illustrates the problem of printing contact holes through pitch utilizing prior art techniques.

FIG. 2 illustrates the problem of printing contact holes through pitch utilizing prior art techniques. Referring to FIG. 2 it is shown that isolated contacts image best with low sigma conventional illumination. However, dense contacts image best with strong off-axis illumination. Accordingly, in order to print both isolated and dense contact holes utilizing the prior art techniques, it was necessary to either utilize a double exposure/two mask process for printing the dense and isolated or split-pitches, or generate a custom illumination. As is known, using double exposure masks increases the cost and is constrained by mask-to-mask overlay accuracy. Further, custom illumination with a single exposure mask can perform better than OAI, but it is best suited for periodic design patterns with limited distribution of spatial frequency in the mask patterns.

Moreover, when printing dense contacts with conventional illumination, the dense pitch is limited by $\lambda/(NA(1+\sigma))$, where NA is the numerical aperture and $\lambda$ is the coherence ratio. For printing very dense contact mask features using low $\sigma$ (<0.4) conventional illumination, alternating PSM can be considered. However, the mask design can be extremely complicated due to the unavoidable phase conflict constraint. When utilizing attenuated PSM or CPL mask under strong off-axis illumination ($\sigma$-outer→1.0), it is possible to print denser pitch (as oppose to low a conventional illumination). However for the isolated and semi-isolated contact features, both ASB and NPF are necessary to be applied in order to match the printing performance for the dense ones.

Thus, the prior art techniques do not provide a simple solution for printing a random contact hole pattern through pitch.

Figure 3A:
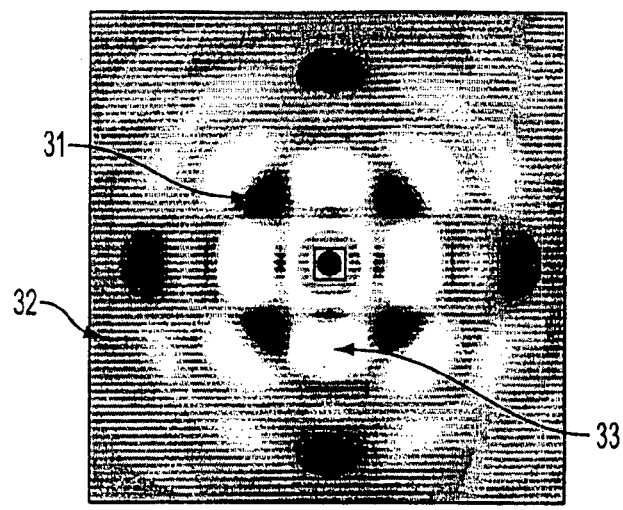
FIGS. 3(a)-3(f) illustrate interference maps of the present invention derived from three different illumination settings utilizing the process of the present invention.
Figure 3B:
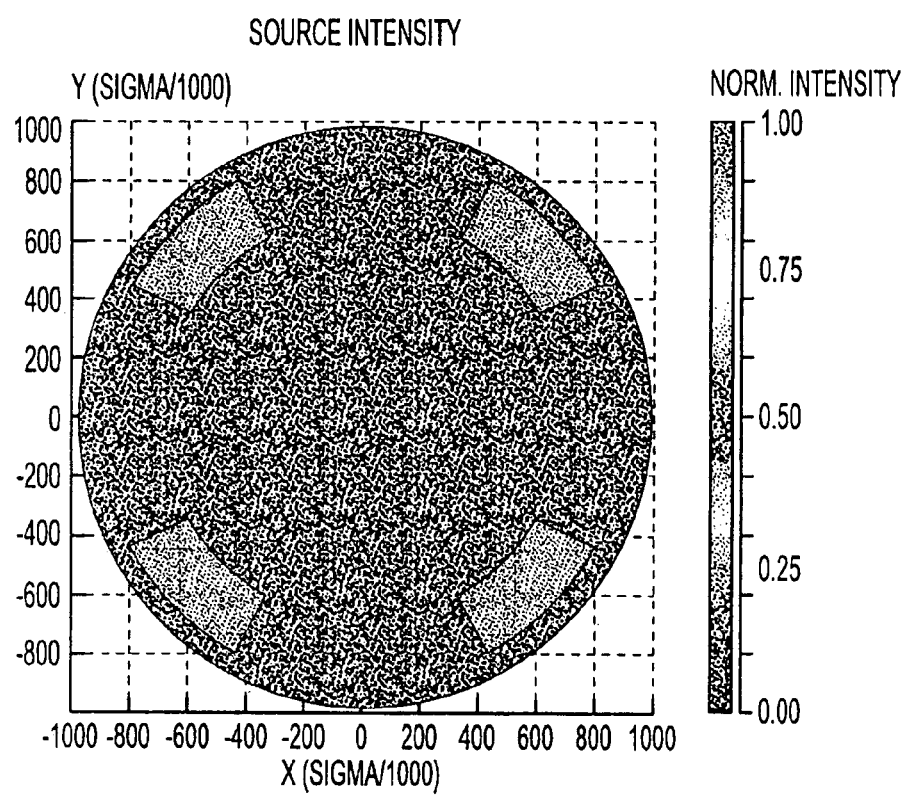
Figure 3C:
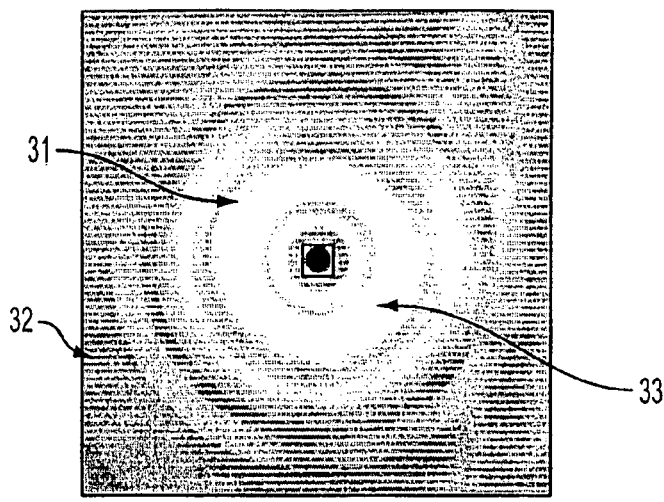
Figure 3D:
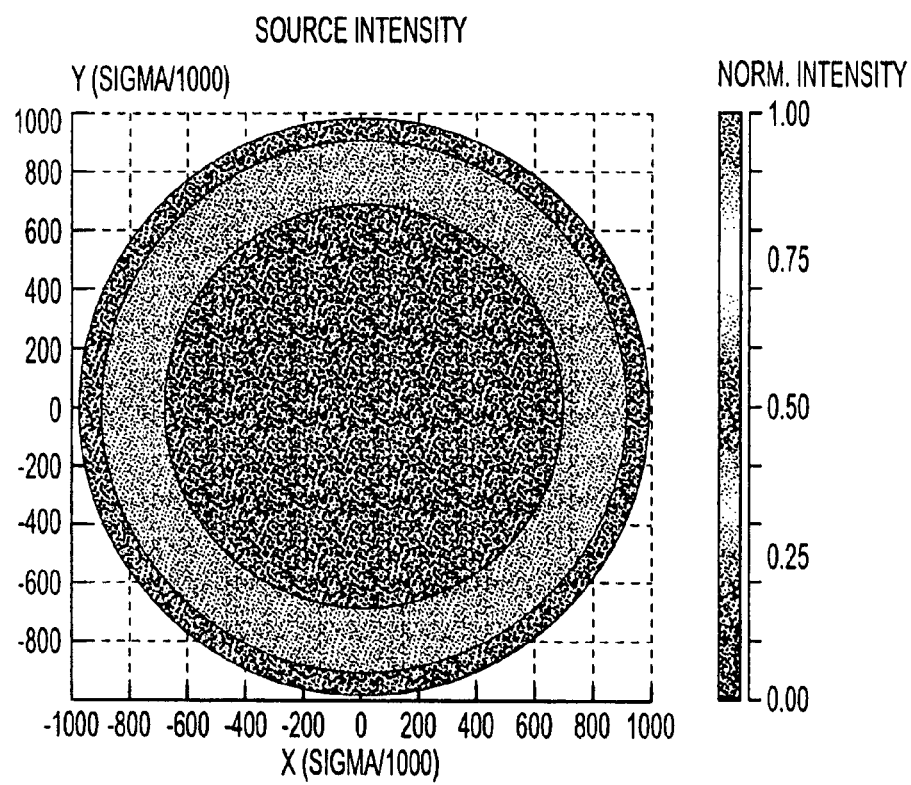
Figure 3E:
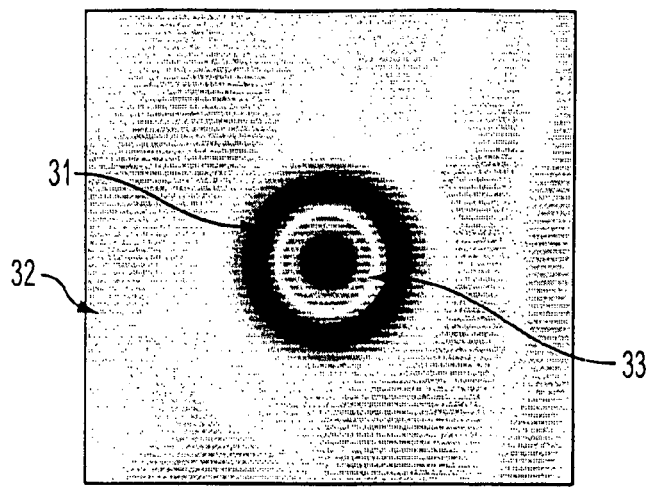
Figure 3F:
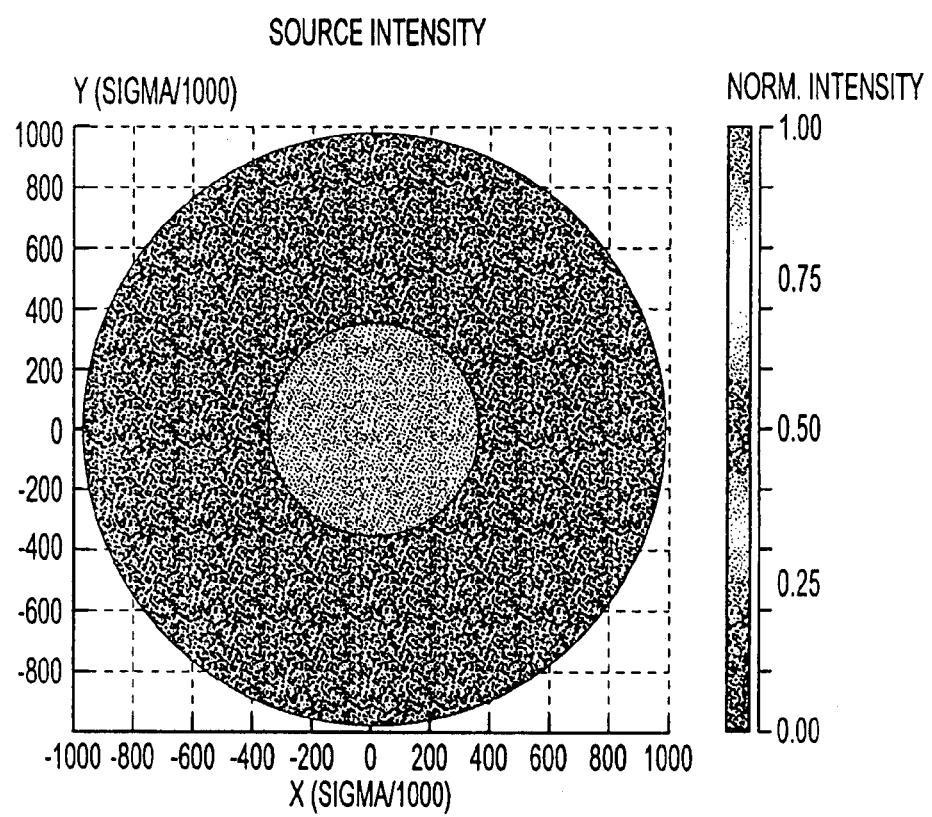

FIGS. 3(a)-3(f) illustrate interference maps of the present invention derived from three different illumination settings utilizing the process of the present invention. As noted above, the IM is dependent upon illumination and processing conditions of the imaging system. As such, the IM must be generated utilizing the settings which will be utilized to image the resulting mask. In the example illustrated in FIG. 3, a 100 nm isolated contact hole feature is exposed utilizing a 193 nm (ArF) laser and 0.75 NA. The resulting IMs formed by QUASAR, Annular, and low a conventional illumination (i.e., $\sigma$=0.4) are shown in FIGS. 3(a), (c), and (e) respectively. FIGS. 3(b), 3(d) and 3(f) illustrate the three illumination settings, respectively.

Referring to FIG. 3(a), which illustrates the IM generated utilizing Quasar illumination (shown in FIG. 3(b)), the regions 31 correspond to areas of constructive interference (i.e., areas having an intensity level above the DC modulation level) and therefore enhance the intensity of the contact hole, the regions 32 correspond to areas which are neutral (i.e., neither constructive nor destructive—areas having an intensity level substantially equal to the DC modulation level) and the areas 33 correspond to areas of destructive interference (i.e., areas having an intensity level below the DC modulation level) which degrade the intensity of the contact hole. FIGS. 3(c) and 3(e) illustrate the interference maps generated utilizing annular and conventional illuminations, respectively.

Figure 4A:
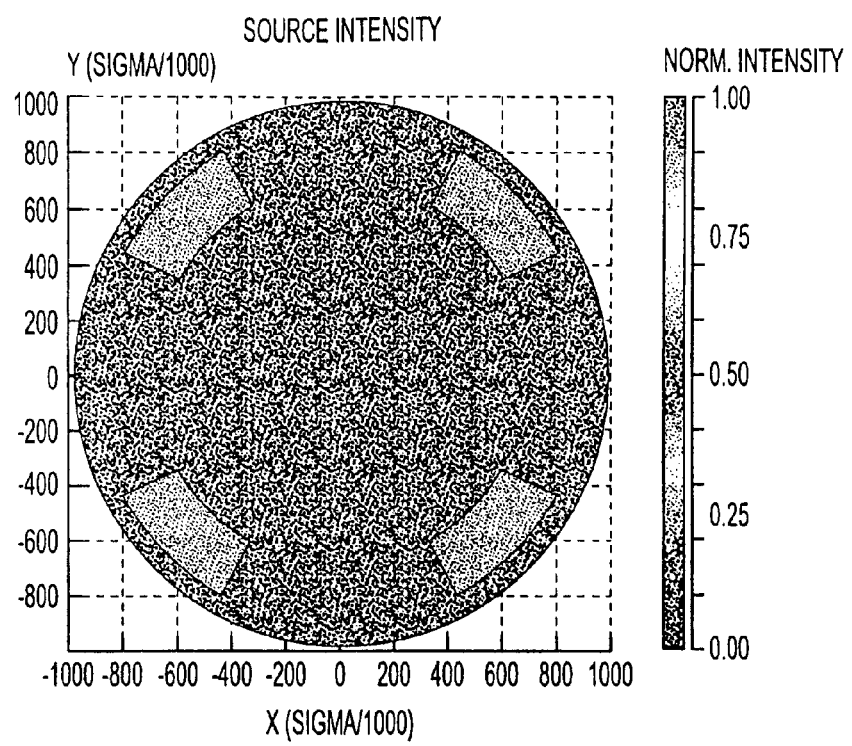
FIG. 4 illustrates how the IM illustrated in FIG. 3(a) can be utilized to modified the target mask pattern to include the OPC features.
Figure 4B:
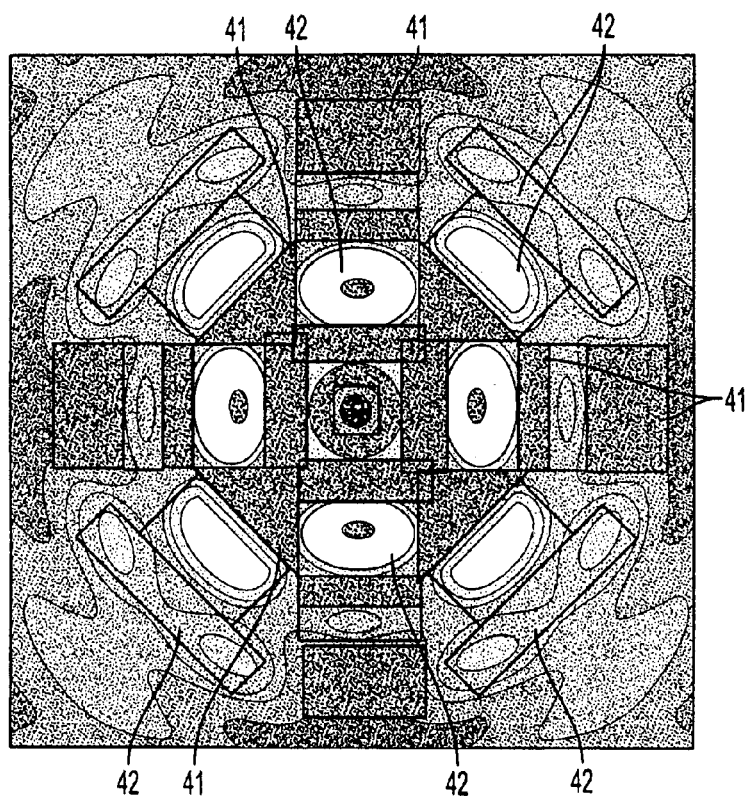

FIG. 4 illustrates how the IM illustrated in FIG. 3(a) can be utilized to modify the target mask pattern to include the OPC features. Referring to FIG. 4, as shown therein the modified mask pattern is superimposed over the IM. As noted above, the areas of constructive interference (areas 31 in FIG. 3(a)) have π-phase shifted features disposed therein in the corresponding portion of the modified mask pattern. These areas are indicated by elements 41 in FIG. 4. The areas of destructive interference (areas 33 in FIG. 3(a)) have non-phase shifted features disposed therein in the corresponding portion of the modified mask pattern. These areas are indicated by elements 42 in FIG. 4. Finally, the neutral areas (areas 32 in FIG. 3(a)) do not have any assist features placed therein in the given example. Thus, FIG. 4 illustrates how the assist features are disposed with the target mask pattern in accordance with the present invention.

Figure 5A:
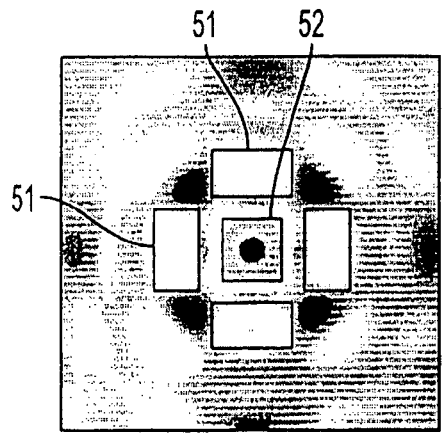
FIGS. 5(a)-5(h) illustrate additional examples of how the mask pattern containing assist features is generated utilizing the IM in accordance with the present invention, and simulated aerial images of the resulting contact pattern.
Figure 5B:
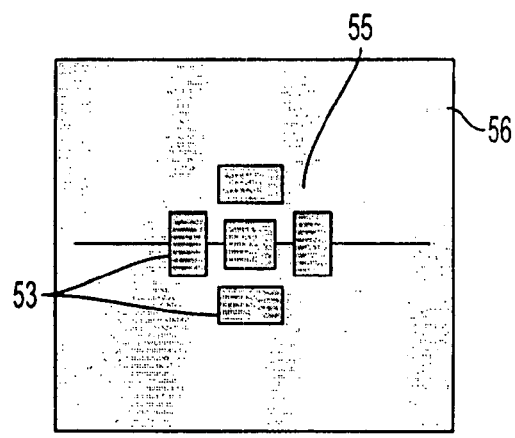
Figure 5C:
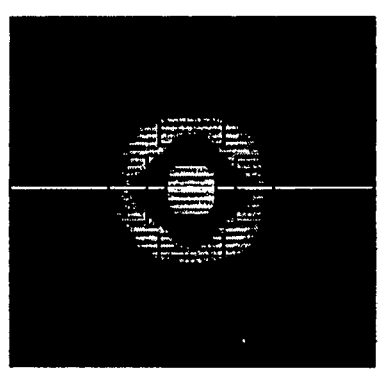
Figure 5D:
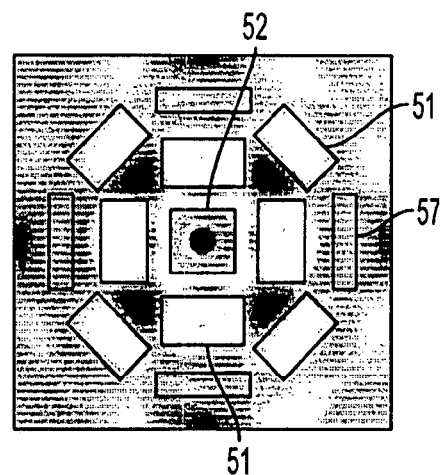
Figure 5E:
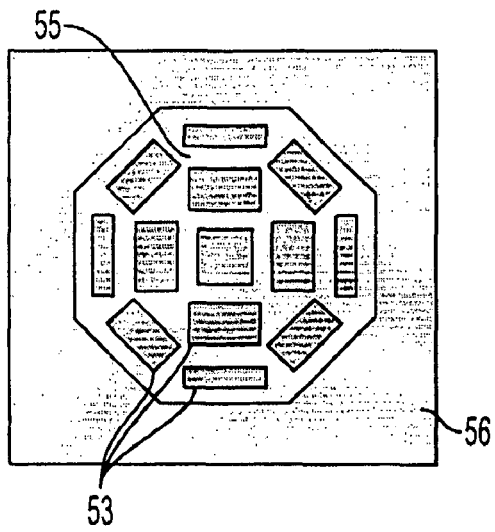
Figure 5F:
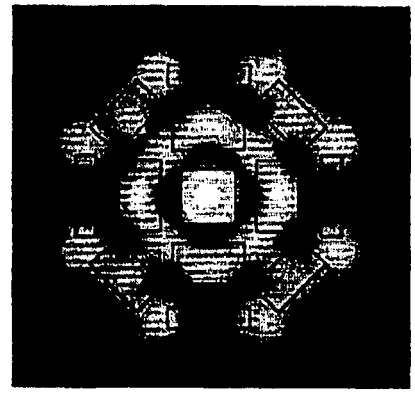
Figure 5G:
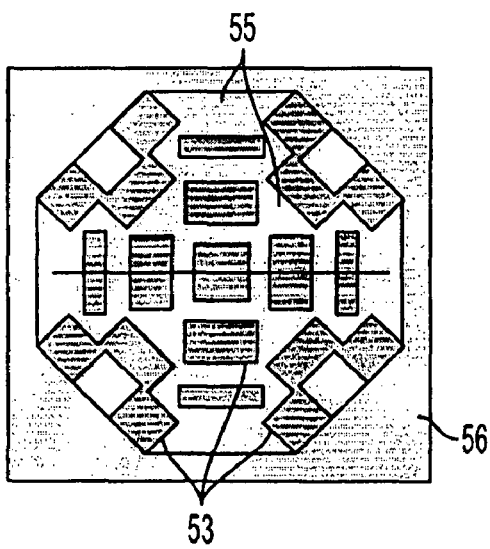

FIGS. 5(a)-5(h) illustrate additional examples of how the mask pattern containing assist features is generated utilizing the IM in accordance with the present invention, and simulated aerial images of the resulting contact pattern. More specifically, FIGS. 5(b), 5(e) and 5(g) illustrate designing a CPL isolated contact mask pattern to be imaged utilizing Quasar illumination. It is noted that the interference maps illustrated in FIGS. 5(a) and 5(d) correspond to the interference map illustrated in FIG. 3(a), and contain non-printing features 51 superimposed on the destructive regions 33 of the IM map. The contact hole is represented by element 52. FIG. 5(d) illustrates the same IM, however, the area of interest around the contact hole in which assist features are placed is expanded in comparison to FIG. 5(a). FIGS. 5(b) and 5(e) correspond to the CPL design of the modified mask pattern corresponding to FIGS. 5(a) and 5(d) respectively. Referring to FIG. 5(b), the areas 33 correspond to destructive interference areas and therefore have non-phase shifted features 53 disposed therein in the mask design. The contact hole 54 has the same phase as the non-phase shifted features 53. The areas surrounding the destructive areas correspond to constructive interference areas 32 as described above in conjunction with FIG. 3(a). As such, these areas have π-phase shifted features 55 disposed therein in the mask design. The areas outside of the area of interest is deemed to be neutral, and therefore zero transmission features 56 (i.e., chrome) are disposed in this area. In the given example, the transmission of the phase-shifted features 55 and the non-phase-shifted 53 features is 100%. FIG. 5(e) illustrates an example of the mask design for the same IM in which the area of interest for placing assist features is expanded beyond that illustrated in FIG. 5(b). As shown in FIG. 5(e), additional non-phase shifted features 53 are added to the areas of destructive interference, and additional areas of π-phased shifted features 55 corresponding to constructive areas of interference are also added to the mask. In addition, the placement of the π-phased features can be utilized to prevent printing of the non-phased shifted features. FIG. 5(g) illustrates an example of the mask design for the same IM as shown in FIGS. 5(a) and 5(d) in which the area of interest for placing assist features is expanded beyond that illustrated in FIG. 5(e). Similar to FIG. 5(e), additional non-phase shifted features 53 are added to the areas of destructive interference, and additional areas of π-phased shifted features 55 corresponding to constructive areas of interference are also added to the mask.

Figure 5H:
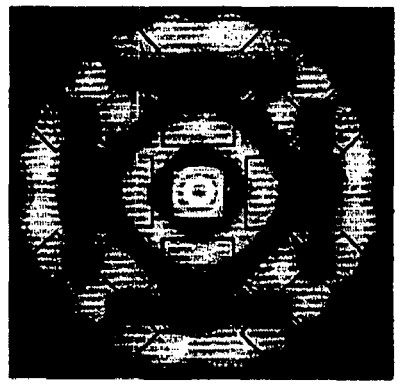

FIGS. 5(c), 5(f) and 5(h) illustrated the simulated 2-dimensional image of the mask patterns illustrated in FIGS. 5(b), 5(e) and 5(g), respectively. As shown, as the area of interest is expanded, and the more assist features that are applied, the better the resulting printing performance. However, it is noted that as more assist features are applied, the more complicated that the mask design becomes. Accordingly, the designer should decide how large are area of interest in necessary to obtain acceptable results, which can be done, for example, by using the simulation process and varying the area of interest.

It is important to note that, as shown in FIG. 5(a), the center of the interference map for a CPL contact is dark (i.e., it has very low light transmission). Thus, the center is formed by destructive interference. However, after correction is applied to the actual CPL pattern design, the center intensity is peaked as intended for a contact hole mask as is shown in FIGS. 5(c), 5(f) and 5(h).

Figure 6A:
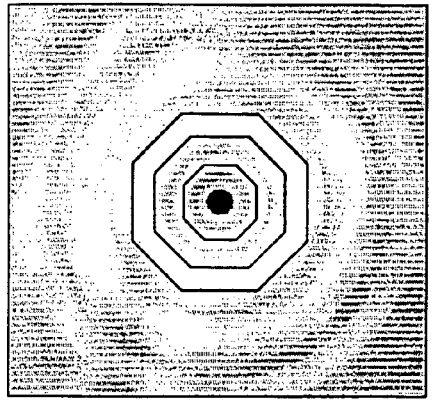
FIGS. 6(a)-6(f) illustrates how a CPL isolated contact mask is generated from the IM resulting from the annular illumination as illustrated in FIG. 3(c).
Figure 6B:
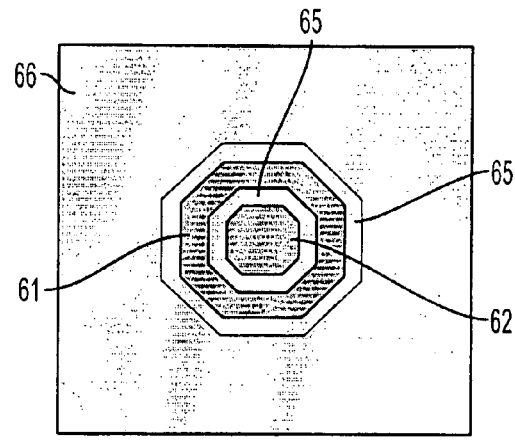
Figure 6C:
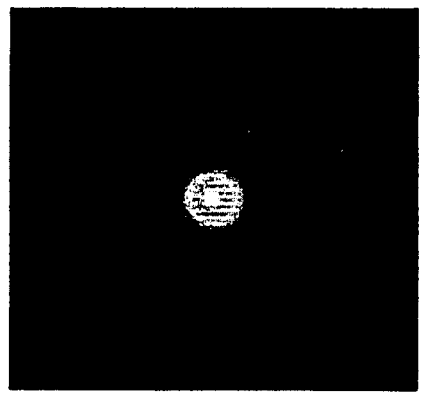
Figure 6D:
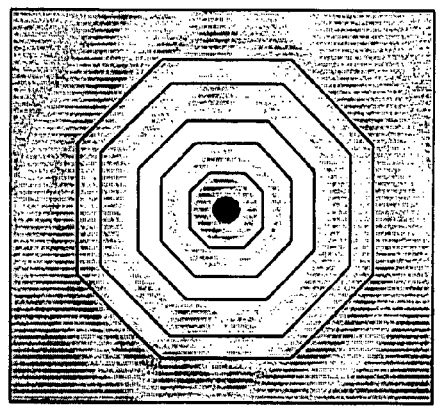
Figure 6E:
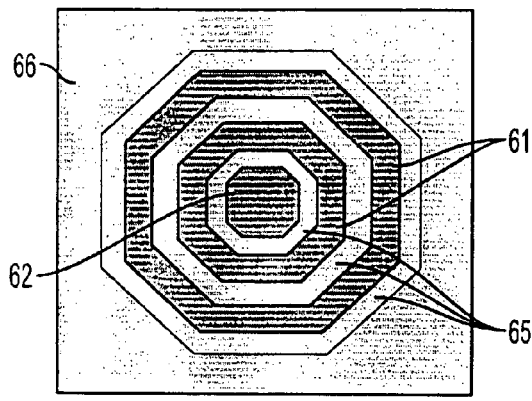
Figure 6F:
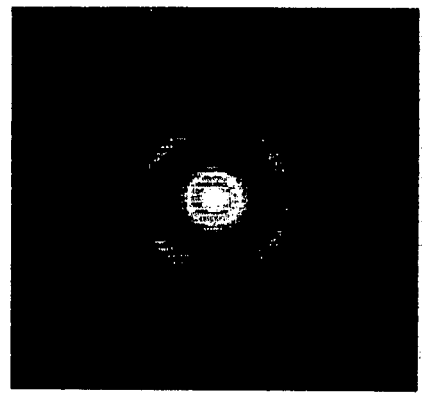

FIGS. 6(a)-6(f) illustrates how a CPL isolated contact mask is generated for the IM resulting from the annular illumination as illustrated in FIG. 3(c). Similar to the discussion set forth above in conjunction with FIGS. 5(a)-5(h), FIG. 6(a) corresponds to the interference map illustrated in FIG. 3(c), and contains non-printing features 61 superimposed on the destructive region 33 of the IM map. The contact hole is represented by element 62. FIG. 6(d) illustrates the same IM, however, the area of interest around the contact hole in which assist features are placed is expanded in comparison to FIG. 6(a). FIGS. 6(b) and 6(e) correspond to the CPL design of the modified mask pattern corresponding to FIGS. 6(a) and 6(d) respectively. Referring to FIG. 6(b), the areas 33 correspond to destructive interference areas and therefore have non-phase shifted features 61 disposed therein in the mask design. The contact hole 62 has the same phase as the non-phase shifted features 61. The areas surrounding the destructive areas 61 correspond to constructive interference areas 32 as described above in conjunction with FIG. 3(c). As such, these areas have π-phase shifted features 65 disposed therein in the mask design. The area outside of the area of interest is deemed to be neutral, and therefore zero transmission features 66 (i.e., chrome) are disposed in this area. In the given example, the transmission of the phase-shifted features 61 and the non-phase-shifted features 65 is 100%. FIGS. 6(c) and 6(f) illustrate the simulated 2-dimensional image of the mask patterns illustrated in FIGS. 6(b) and 6(e), respectively. Once again, as the area of interest is expanded, and the more assist features that are applied, the better the resulting printing performance.

Figure 7:
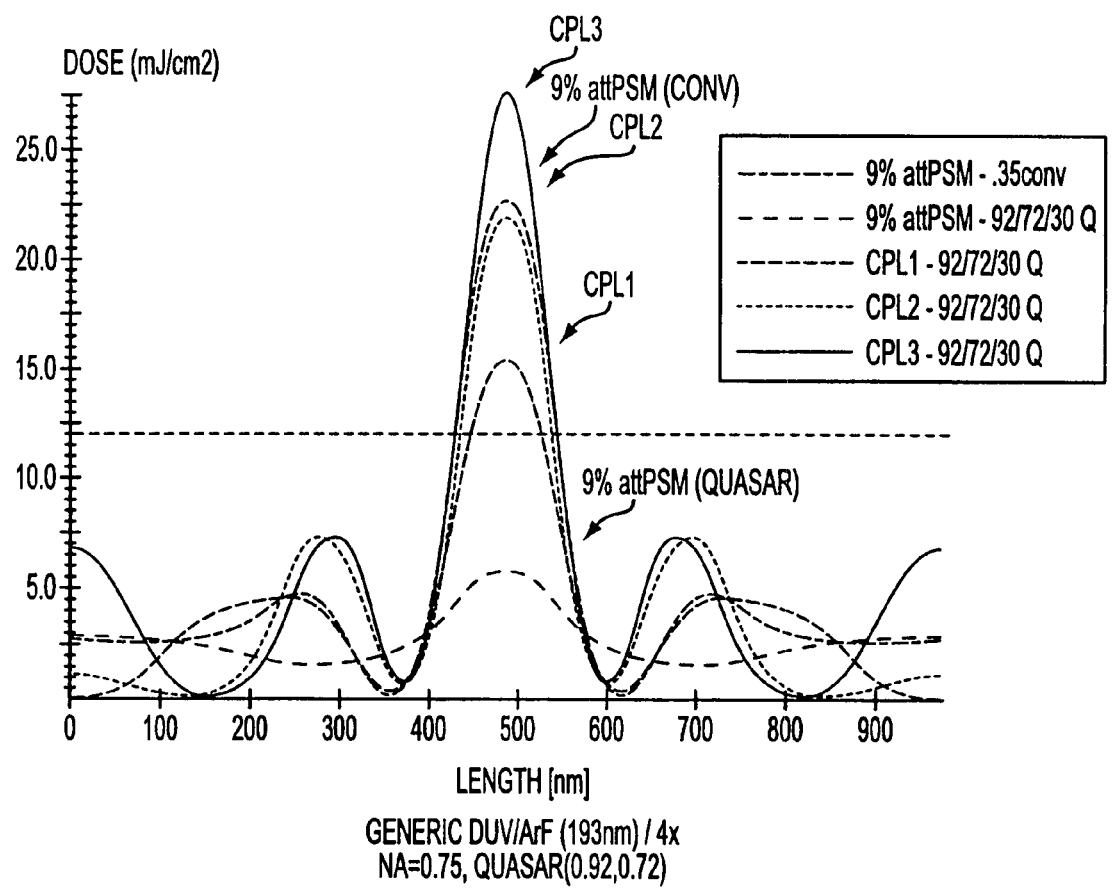
FIG. 7 illustrates a comparison of the predicted printing performance using peak aerial image intensity for the three CPL contact mask designs in FIG. 5.

FIG. 7 illustrates a comparison of the predicted printing performance using peak aerial image intensity for the three CPL contact mask designs illustrated in FIGS. 5(b)—CPL1; 5(e)—CPL2; and 5(g)—CPL3 utilizing Quasar illumination versus the typical 9% attenuated contact hole mask without any OPC.

As shown, the chart includes the 9% attSPM (conventional, σ=0.35) and 9% attPSM (Quasar) in order to illustrate the upper and lower bound respectively of the potential printing performance. Referring to FIG. 7, for printing a contact hole mask, the higher the peak intensity, the better the expected printing performance. As illustrated, the CPL3 design has the best expected printing performance since it has the most comprehensive design of ASB and NPF. The CPL1 design has a relatively simpler design, yet the printing performance is significantly improved as compare to a 9% attPSM contact mask under Quasar illumination. Finally, the CPL2 design has substantially the same performance as the 9% attSPM conventional illumination.

Figure 8:
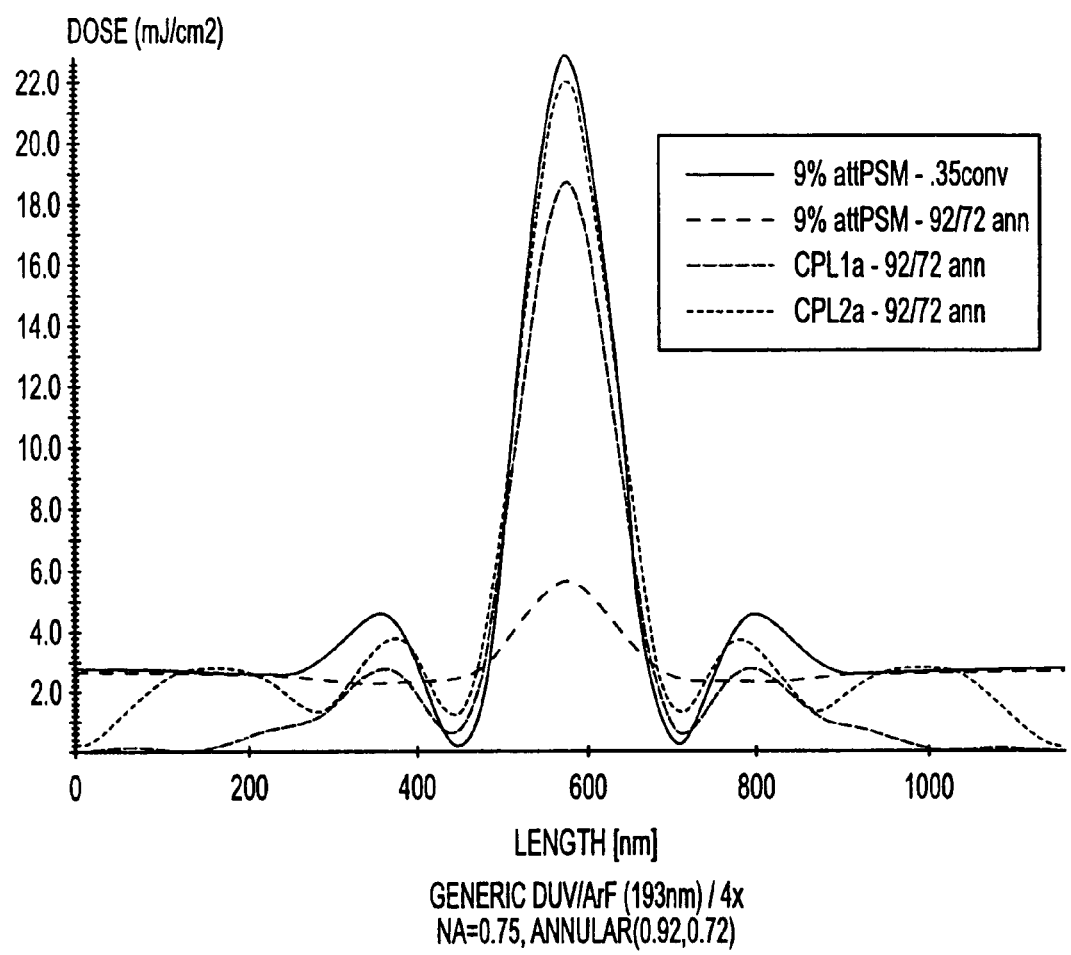
FIG. 8 illustrates a comparison of the predicted printing performance using peak aerial image intensity for the two CPL contact mask designs in FIG. 6.

FIG. 8 illustrates a comparison of the predicted printing performance using peak aerial image intensity for the two CPL contact mask designs illustrated in FIGS. 6(b)—CPL1 and 6(e)—CPL2 utilizing annular illumination versus the typical 9% attenuated contact hole mask without any OPC.

As shown, CPL contact mask design with annular illumination shows significant improvement for the peak intensity levels versus the 9% attPSM contact (no OPC) with annular illumination. As with the Quasar illumination example, the more comprehensive the OPC design, the better the resulting printing performance. As shown in FIG. 8, the predicted printing performance of CPL2 design with annular illumination is very close to 9% attPSM conventional illumination (σ=0.35).

Figure 9A:
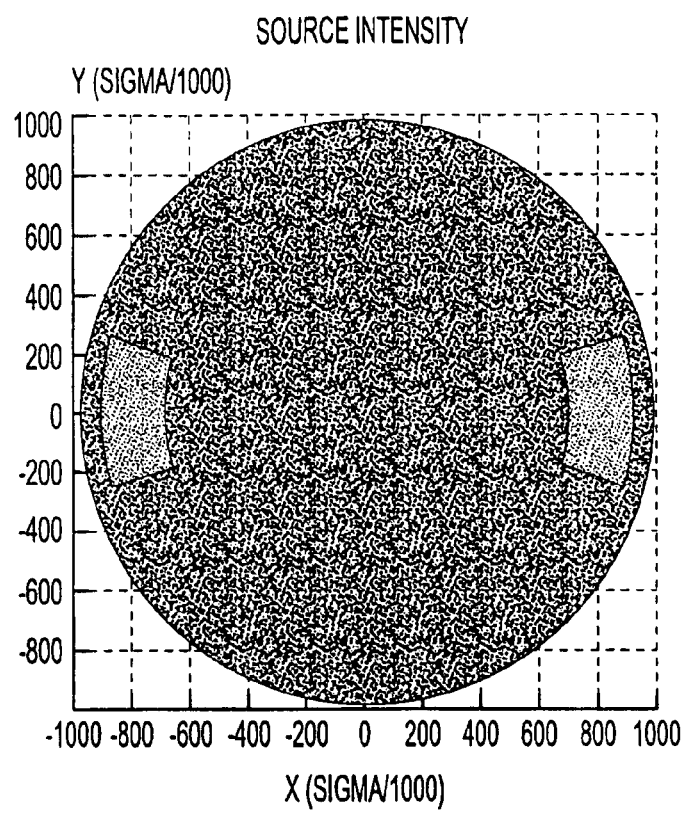
FIG. 9(a) illustrates an example of a dipole illuminator.
Figure 9B:
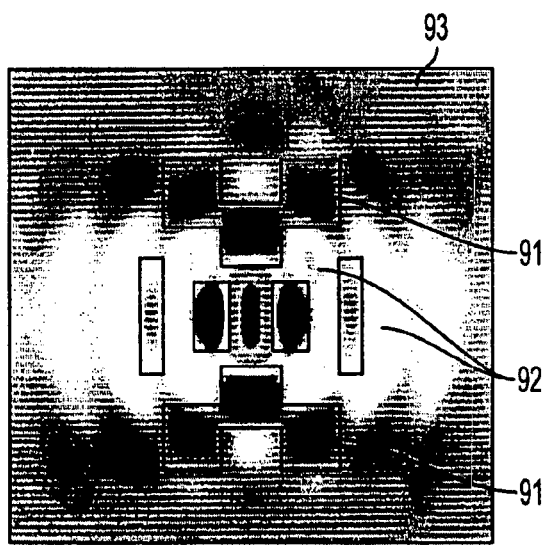
FIGS. 9(b) and 9(c) illustrate the resulting interference map associated with an isolated contact hole.
Figure 9C:
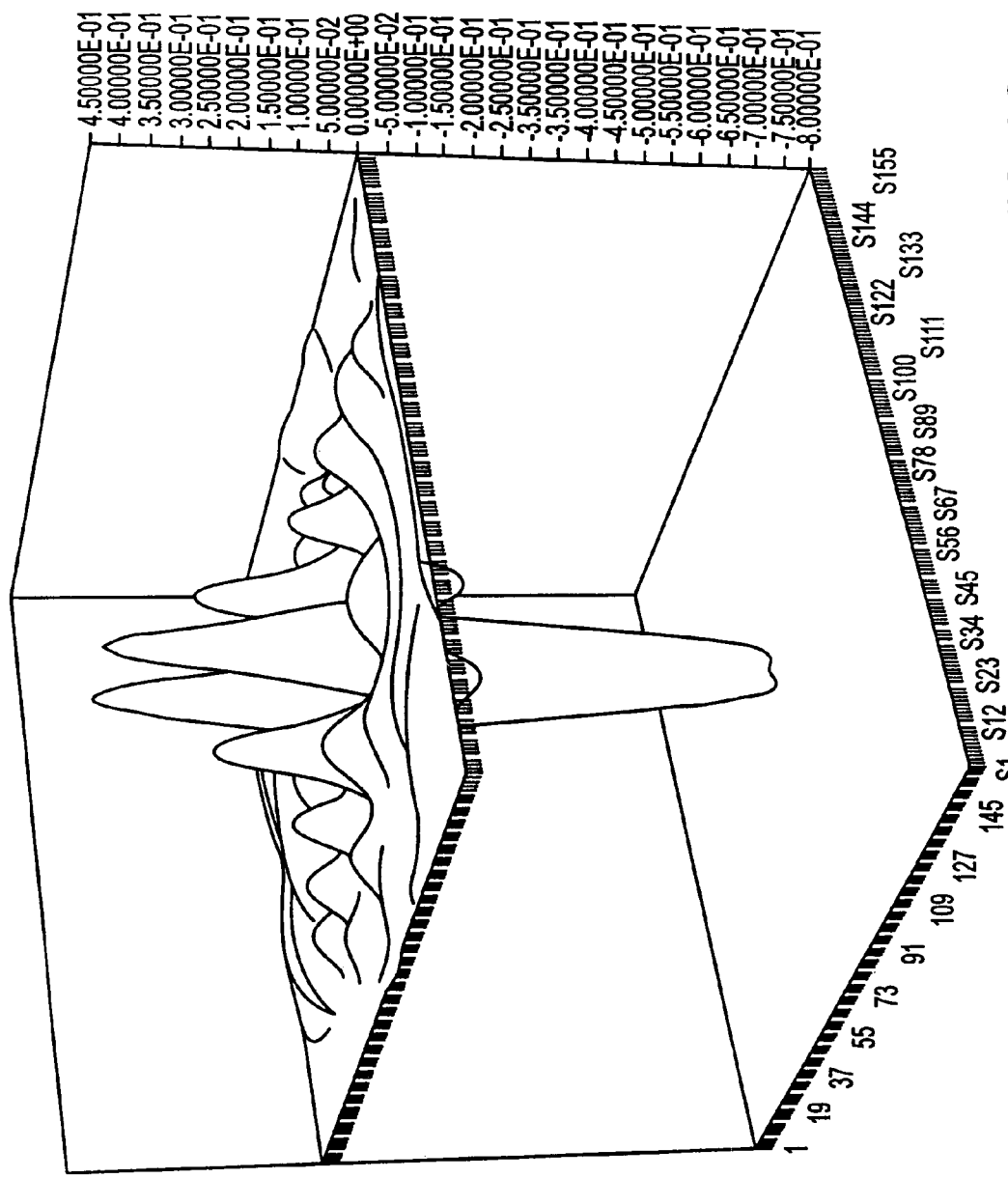

It is noted that the method of the present invention can also be utilized with other illuminations, for example, dipole illumination. FIG. 9(a) illustrates an example of a dipole illuminator. FIG. 9(b) illustrates the resulting interference map associated with an isolated contact hole. As shown in FIG. 9(b), the IM indicates constructive interference areas 91, destructive interference areas 92 and neutral areas 93. Continuing with the current example utilized throughout the foregoing figures, the constructive interference areas 91 would have π-phase shifted assist features placed therein in the mask pattern, and the destructive interference areas 92 would have non-phase shifted assist features placed therein in the mask pattern. The neutral areas 93 would have 0-transmission assist features disposed therein. FIG. 9(c) illustrates a 3-dimensional image of the IM illustrated in FIG. 9(b). As shown, the IM has both negative and positive values, which are utilized to determine areas of constructive and destructive interference.

Figure 10A:
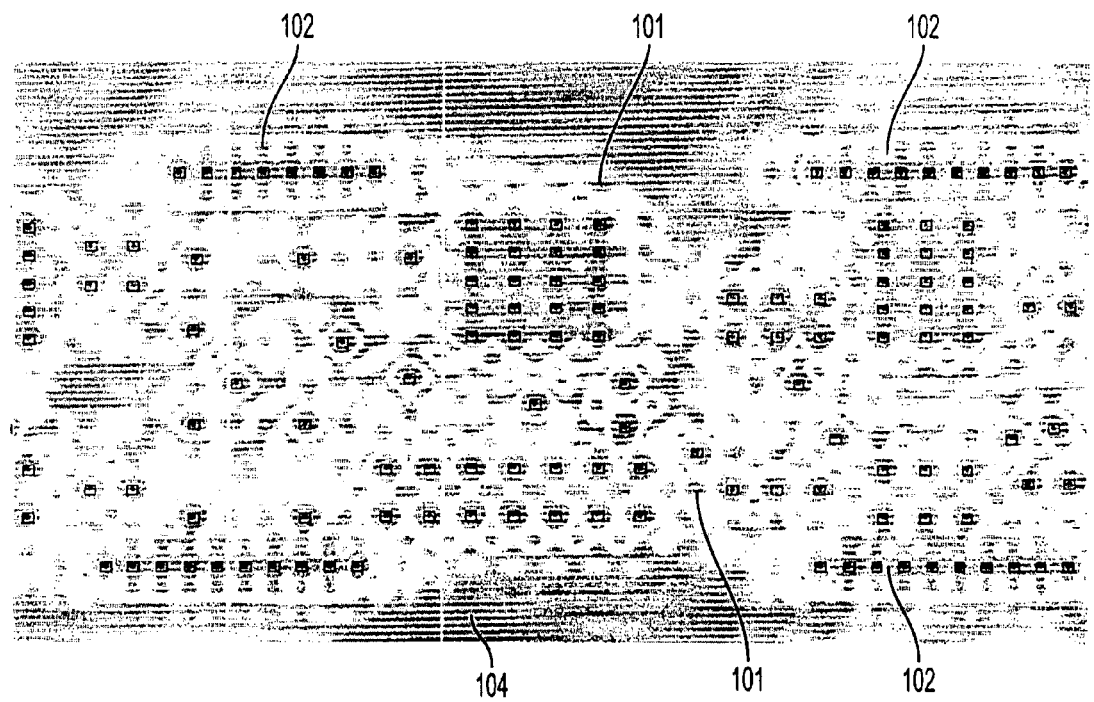
FIG. 10(a) is an example of an IM for a random contact pattern.
Figure 10B:
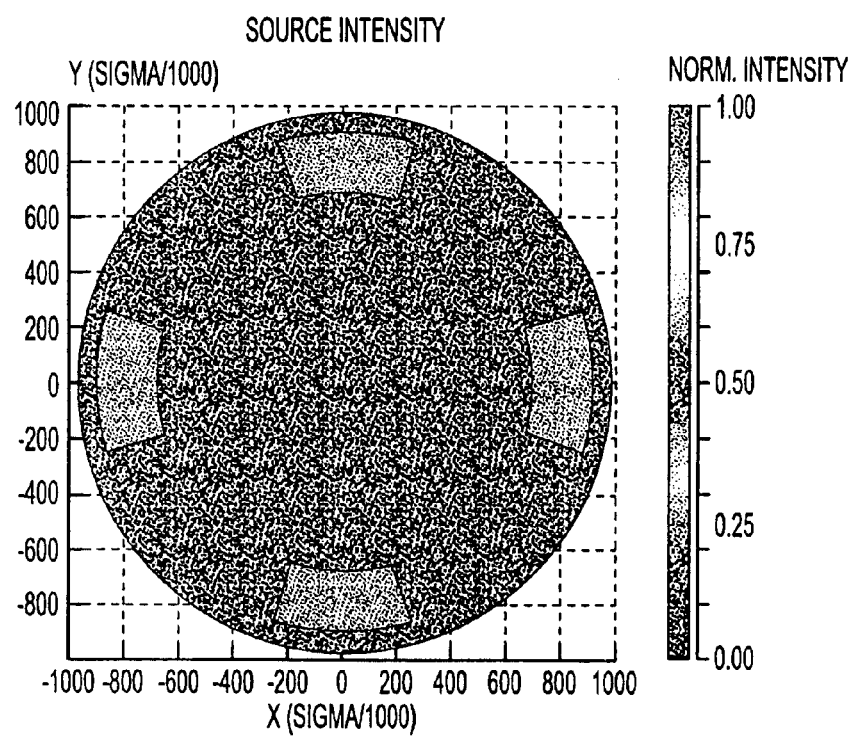
FIG. 10(b) illustrates the illuminator utilized to perform the simulation.

FIG. 10(a) is an example of an IM for a random contact pattern. Similar to the previous examples, , the areas 101 of the field indicate areas where the aerial image intensity is greater than 0.10, areas 102 indicate areas where the aerial image intensity is less than 0.10, and the areas 104 are regions where the aerial image intensity is near 0.10. This simulation was performed utilizing ArF, 0.75 NA, 0.92/0.72/30 deg c-Quad illumination, as shown in FIG. 10(b). As in the previous examples, once the IM is generated and the foregoing regions determined, the assist features can be positioned in the mask pattern in the manner discussed above.

Thus, the method of the present invention describes a novel OPC technique encompassing the use of IM and SB, ASB and NPFs. By utilizing the present invention, it is possible to achieve optimum printing performance using OAI (or any other illumination) for a full pitch range of mask features that are in deep sub-wavelength dimension.

It is also possible to perform the method of the present invention automatically so as to generate the optimum OPC mask design. This can be accomplished utilizing an electronic CAD design tool, such as MaskWeaver.

Figure 11:
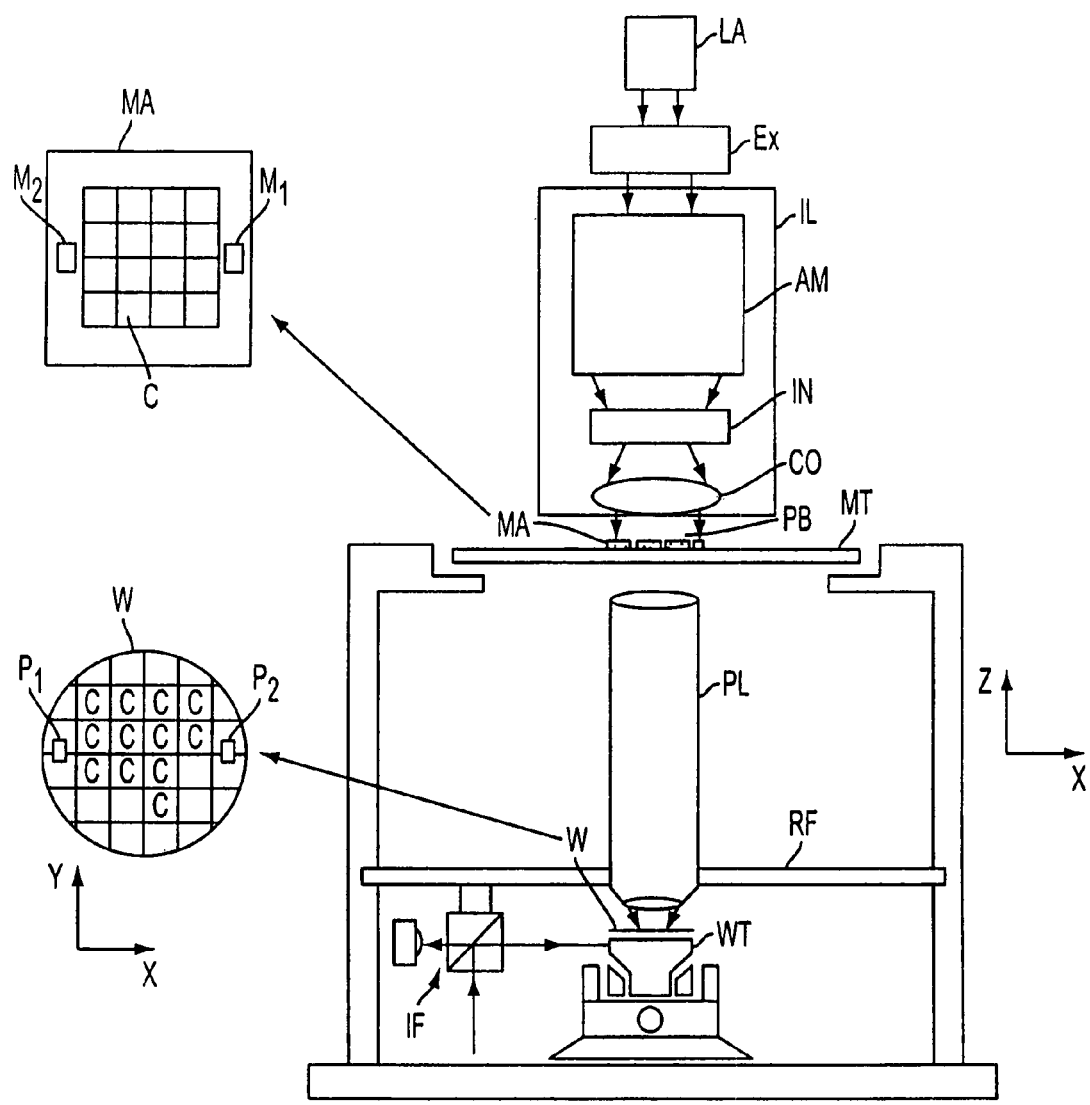
FIG. 11 schematically depicts a lithographic projection apparatus suitable for use with the masks designed with the aid of the current invention.

FIG. 11 schematically depicts a lithographic projection apparatus suitable for use with the masks designed with the aid of the current invention. The apparatus comprises:

a radiation system Ex, IL, for supplying a projection beam PB of radiation. In this particular case, the radiation system also comprises a radiation source LA;

a first object table (mask table) MT provided with a mask holder for holding a mask MA (e.g. a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g. a refractive, catoptric or catadioptric optical system) for imaging an irradiated portion of the mask MA onto a target portion C (e.g. comprising one or more dies) of the substrate W.

As depicted herein, the apparatus is of a transmissive type (i.e. has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g. a mercury lamp, excimer laser or plasma discharge source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 11 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g. with the aid of suitable directing mirrors); this latter scenario is often the case when the source LA is an excimer laser (e.g. based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 11. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The software functionalities of a computer system involve programming, including executable code, may be used to implement the above described imaging model. The software code is executable by the general-purpose computer. In operation, the code and possibly the associated data records are stored within a general-purpose computer platform. At other times, however, the software may be stored at other locations and/or transported for loading into the appropriate general-purpose computer systems. Hence, the embodiments discussed above involve one or more software products in the form of one or more modules of code carried by at least one machine-readable medium. Execution of such code by a processor of the computer system enables the platform to implement the catalog and/or software downloading functions, in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s) operating as one of the server platform, discussed above. Volatile media include dynamic memory, such as main memory of such a computer platform. Physical transmission media include coaxial cables; copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read programming code and/or data. Many of these forms of computer readable media may be involved in carrying one or more sequences of one or more instructions to a processor for execution.

As described above, the method of the present invention provides important advantages over the prior art. Most importantly, the OPC technique of the present invention allows for deep sub-wavelength mask patterns to be imaged using substantially any illumination condition through pitch. As a result, the present invention provides a technique for printing, for example, contact arrays having randomly placed contacts ranging from isolated contacts to dense contacts (i.e., not all contacts uniformly spaced from one another) utilizing a single illumination. In contrast, prior art OPC techniques typically required multiple exposures in order to allow for printing of both isolated and densely spaced features to obtain acceptable resolution results. One specific advantage is that the present invention realizes optimum printing performance for a full-pitch range features utilizing OAI.

Further, variations of the foregoing method are also possible. For example, the method can be used for both binary reticle patterns (0 and +1 of the electric field amplitude) and for phase shift reticle patterns (0, +1, and −1 of the electric field amplitude). The foregoing examples have illustrated the method of the present invention for printing bright mask patterns on a dark-field mask type. However, the same method can be equally well applied to printing a full pitch range of dark features on a bright-field mask type.

In addition, the concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20 -5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

It is also noted that while the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although certain specific embodiments of the present invention have been disclosed, it is noted that the present invention may be embodied in other forms without departing from the spirit or essential characteristics thereof. The present embodiments are therefore to be considered in all respects as illustrative and not restrictive, the scope of the invention being indicated by the appended claims, and all changes that come within the meaning and range of equivalency of the claims are therefore intended to be embraced therein.

We claim:

1. A computer-implemented method of generating an interference map for optimal positioning of optical proximity correction features in the design of a mask used in an imaging system, said method comprising the steps of:

obtaining a desired target pattern in the mask having target pattern features to be imaged on a substrate;

generating a reduced size target pattern by reducing the size of the target pattern features without changing the pitches therebetween, such that the size of at least one of the target pattern features is less than the resolution capability of an image system to be utilized to image the mask;

adjusting optical transmission of a dark field area of the reduced size target pattern to be greater than zero but greatly less than optical transmission of a bright field area; and performing, using the computer, an optical simulation of the reduced size target pattern to generate the interference map based on the desired target pattern, said interference map defining areas of constructive interference and areas of destructive interference between at least one of target pattern features to be imaged and a field area adjacent said at least one target pattern feature, wherein optical proximity correction features which enhance the printing of the target pattern feature to be imaged are disposed in constructive areas of interferences, and optical proximity correction features which negate destructive interference are disposed in destructive areas of interference.

2. The method of claim 1, wherein a critical dimension of the target pattern features in the reduced size target pattern is less than $\lambda/(2\pi \cdot NA)$, where $\lambda$ is an exposure wavelength and NA is the numerical aperture of the imaging system.

3. The method of claim 1, wherein said interference map also defines neutral areas of interference, said neutral areas not resulting in either constructive interference or destructive interference relative to the target pattern feature to be imaged.

4. The method of claim 1, wherein the optical proximity correction features to be disposed in said mask design comprises scatter bars, anti-scatter bars and non-printing assist features.

5. The method of claim 1, wherein the interference map defines intensity levels of the field relative to the target pattern features to be imaged, said interference map being capable of representing both positive and negative values of intensity relative to a non-zero DC level, wherein regions of the field having intensity values which are positive relative to said non-zero DC level correspond to constructive areas of interference, and regions of the field having intensity values which are negative relative to said non-zero DC level correspond to destructive areas of interference areas.

6. The method of claim 1, wherein the method further includes:

shifting a phase of one or more optical proximity correction features.

7. The method of claim 1, wherein the target pattern features include isolated features.

8. The method of claim 1, wherein the method is independent of the pitch between the target pattern features.

9. The method of claim 1, wherein the method is independent of the type of illumination used in the imaging system.

10. An apparatus for generating an interference map for optimal positioning of optical proximity correction features in the design of a mask used in an imaging system, said apparatus comprising:

means for obtaining a desired target pattern in the mask having target pattern features to be imaged on a substrate;

means for generating a reduced size target pattern by reducing the size of the target pattern features without changing the pitches therebetween, such that the size of at least one of the target pattern features is less than the resolution capability of an image system to be utilized to image the mask;

means for adjusting optical transmission of a dark field area of the reduced size target pattern to be greater than zero but greatly less than optical transmission of a bright field area; and means for performing an optical simulation of the reduced size target pattern to generate the interference map based on the desired target pattern, said interference map defining areas of constructive interference and areas of destructive interference between at least one of target pattern features to be imaged and a field area adjacent said at least one target pattern feature, wherein optical proximity correction features which enhance the printing of the target pattern feature to be imaged are disposed in constructive areas of interferences, and optical proximity correction features which negate destructive interference are disposed in destructive areas of interference.

11. The apparatus of claim 10, wherein a critical dimension of the target pattern features in the reduced size target pattern is less than $\lambda/(2\pi \cdot NA)$, where $\lambda$ is an exposure wavelength and NA is the numerical aperture of the imaging system.

12. The apparatus of claim 10, wherein said interference map also defines neutral areas of interference, said neutral areas not resulting in either constructive interference or destructive interference relative to the target pattern feature to be imaged.

13. The apparatus of claim 10, wherein the optical proximity correction features to be disposed in said mask design comprises scatter bars, anti-scatter bars and non-printing assist features.

14. The apparatus of claim 10, wherein the interference map defines intensity levels of the field relative to the target pattern features to be imaged, said interference map being capable of representing both positive and negative values of intensity relative to a non-zero DC level, wherein regions of the field having intensity values which are positive relative to said non-zero DC level correspond to constructive areas of interference, and regions of the field having intensity values which are negative relative to said non-zero DC level correspond to destructive areas of interference areas.

15. The apparatus of claim 10, wherein a phase of one or more optical proximity correction features is shifted.

16. The apparatus of claim 10, wherein the target pattern features include isolated features.

17. The apparatus of claim 10, wherein the apparatus is configured to perform optical proximity correction independent of the pitch between the target pattern features.

18. The apparatus of claim 10, wherein the apparatus is configured to perform optical proximity correction independent of the type of illumination used in the imaging system.

19. A computer program product for controlling a computer comprising a recording medium readable by the computer, means recorded on the recording medium for directing the computer to generate files corresponding to a mask for use in an lithographic imaging process, said generation of said files comprising the steps of:

obtaining a desired target pattern in the mask having target pattern features to be imaged on a substrate;

generating a reduced size target pattern by reducing the size of the target pattern features without changing the pitches therebetween, such that the size of at least one of the target pattern features is less than the resolution capability of an image system to be utilized to image the mask;

determining that optical transmission of a dark field area of the reduced size target pattern is greater than zero but greatly less than optical transmission of a bright field area; and performing an optical simulation of the reduced size target pattern to generate the interference map based on the desired target pattern, said interference map defining areas of constructive interference and areas of destructive interference between at least one of target pattern features to be imaged and a field area adjacent said at least one target pattern feature, wherein optical proximity correction features which enhance the printing of the target pattern feature to be imaged are disposed in constructive areas of interferences, and optical proximity correction features which negate destructive interference are disposed in destructive areas of interference.

20. The computer program product of claim 19, wherein optical proximity correction features are placed optimally on the mask design based on the generated interference map.

* * * * *